(12) United States Patent
Hisamatsu (10) Patent No.: US 9,871,986 B2
(45) Date of Patent: *Jan. 16, 2018

(54) COUNTER, COUNTING METHOD, AD CONVERTER, SOLID-STATE IMAGING DEVICE, AND ELECTRONIC DEVICE

(71) Applicant: SONY CORPORATION, Tokyo (JP)

(72) Inventor: Yasuaki Hisamatsu, Fukuoka (JP)

(73) Assignee: SONY CORPORATION, Tokyo (JP)

( * ) Notice: Subject to any disclaimer, the term of this patent is extended or adjusted under 35 U.S.C. 154(b) by 30 days.

This patent is subject to a terminal disclaimer.

(21) Appl. No.: 14/691,290

(22) Filed: Apr. 20, 2015

(65) Prior Publication Data

US 2015/0229862 A1 Aug. 13, 2015

Related U.S. Application Data

(63) Continuation of application No. 13/899,711, filed on May 22, 2013, now Pat. No. 9,042,508.

(30) Foreign Application Priority Data

Jun. 20, 2012 (JP) ................................ 2012-138604

(51) Int. Cl.
*H03M 1/34* (2006.01)
*H04N 5/374* (2011.01)
*H03K 23/86* (2006.01)
*H03K 21/02* (2006.01)
*H03K 21/38* (2006.01)
*H04N 5/3745* (2011.01)
*H04N 5/376* (2011.01)

(52) U.S. Cl.
CPC ......... *H04N 5/3742* (2013.01); *H03K 21/023* (2013.01); *H03K 21/026* (2013.01); *H03K 21/38* (2013.01); *H03K 23/86* (2013.01); *H03M 1/34* (2013.01); *H04N 5/3765* (2013.01); *H04N 5/37455* (2013.01)

(58) Field of Classification Search
CPC .................................................. H04N 5/3742
See application file for complete search history.

(56) References Cited

U.S. PATENT DOCUMENTS 9,042,508 B2 * 5/2015 Hisamatsu ........... H03K 21/023
377/116

* cited by examiner

*Primary Examiner* — Hai L Nguyen
(74) *Attorney, Agent, or Firm* — Chip Law Group (57) ABSTRACT

A counter configured to perform counting at both edges of an input clock to output an additional value or a subtraction value for a previous count value and a next count value includes a first latch circuit that latches the input clock, a second latch circuit that latches an output from the first latch circuit, a holding section that holds data of the 0th bit of a count value, and a correction section that performs count correction on data of the first and subsequent bits of the count value on the basis of an output of the second latch circuit.

9 Claims, 13 Drawing Sheets

PREVIOUS COUNT VALUE: A
NEXT COUNT VALUE: B
→DESIRED VALUE: B−A (SUBTRACTION VALUE)

■ STATE BEFORE CORRECTION

| STATE | FIRST AND SUBSEQUENT BITS (RIPPLE COUNTER) | LSB 1 | LSB 2 |
|---|---|---|---|
| PREVIOUS COUNT VALUE A | INT [A/2] | MOD [A, 2] | — |
| NEXT COUNT VALUE B (DOWN COUNT) | INT [A/2]+INT [−B/2] | MOD [A, 2] | MOD [B, 2] |
| OUTPUT INVERSION OF FIRST AND SUBSEQUENT BITS | −{INT [A/2]+INT [−B/2]}−1 =−INT [A/2]−INT [−B/2]−1 | MOD [A, 2] | MOD [B, 2] |

■ CORRECTION LOGIC

| CASE | CORRECTION LOGIC | LSB 1 | LSB 2 | FIRST AND SUBSEQUENT BITS x2 | →ERROR FROM DESIRED VALUE | →CORRECTION AMOUNT FOR FIRST AND SUBSEQUENT BITS | LSB DATA |
|---|---|---|---|---|---|---|---|
| | −INT [A/2]−INT [−B/2]−1 | MOD [A, 2] | MOD [B, 2] | | | | |
| A EVEN NUMBER, B EVEN NUMBER | −(A/2)−(−B/2)−1   =(B−A−2)/2 | 0 | 0 | B−A−2 | −2 | 1 UP (1 DOWN BEFORE INVERSION) | 0 |
| A EVEN NUMBER, B ODD NUMBER | −(A/2)−(−B−1)/2−1   =(B−A−1)/2 | 0 | 1 | B−A−1 | −1 | — | 1 |
| A ODD NUMBER, B EVEN NUMBER | −(A−1)/2−(−B/2)−1   =(B−A−1)/2 | 1 | 0 | B−A−1 | −1 | — | 1 |
| A ODD NUMBER, B ODD NUMBER | −(A−1)/2−(−B−1)/2−1=(B−A)/2 | 1 | 1 | B−A | 0 | — | 0 |

PREVIOUS COUNT VALUE: A
NEXT COUNT VALUE: B
⇒ DESIRED VALUE: A+B (ADDITIONAL VALUE)
■ STATE BEFORE CORRECTION

| STATE | FIRST AND SUBSEQUENT BITS (RIPPLE COUNTER) | LSB 1 | LSB 2 |
|---|---|---|---|
| PREVIOUS COUNT VALUE A | INT [A/2] | MOD [A, 2] | — |
| NEXT COUNT VALUE B | INT [A/2] + INT [B/2] | MOD [A, 2] | MOD [B, 2] |

■ CORRECTION LOGIC

| CASE | INT [A/2] + INT [B/2] | | MOD [A, 2] | MOD [B, 2] | FIRST AND SUBSEQUENT BITS ×2 | → ERROR FROM DESIRED VALUE | ERROR CORRECTION FOR RIPPLE COUNTER | LSB DATA |
|---|---|---|---|---|---|---|---|---|
| A EVEN NUMBER, B EVEN NUMBER | (A/2)+(B/2) | =(A+B)/2 | 0 | 0 | A+B | 0 | — | 0 |
| A EVEN NUMBER, B ODD NUMBER | (A/2)+(B−1)/2 | =(A+B−1)/2 | 0 | 1 | A+B−1 | −1 | — | 1 |
| A ODD NUMBER, B EVEN NUMBER | (A−1)/2+(B/2) | =(A+B−1)/2 | 1 | 0 | A+B−1 | −1 | — | 1 |
| A ODD NUMBER, B ODD NUMBER | (A−1)/2+(B−1)/2 | =(A+B−2)/2 | 1 | 1 | A+B−2 | −2 | 1 UP | 0 |

COUNTER, COUNTING METHOD, AD CONVERTER, SOLID-STATE IMAGING DEVICE, AND ELECTRONIC DEVICE

CROSS-REFERENCE TO RELATED APPLICATIONS

The present application is a Continuation of U.S. patent application Ser. No. 13/899,711, filed May 22, 2013, now U.S. Pat. No. 9,042,508 B2 issued on May 26, 2015, which claims priority from Japanese Patent Application No. 2012-138604 filed in the Japanese Patent Office on Jun. 20, 2012, the disclosures of which are hereby incorporated herein by reference.

BACKGROUND

The present disclosure relates to a counter, a counting method, an AD converter, a solid-state imaging device, and an electronic device, and particularly relates to, for example, a counter, a counting method, an AD converter, a solid-state imaging device, and an electronic device each of which is configured such that the power consumption of a column counter, such as a complementary metal oxide semiconductor (CMOS) image sensor and the like, is reduced.

As a solid-state imaging device used for imaging devices of various electronic devices having an imaging function, a CMOS image sensor (which will be hereinafter referred to as a "CIS") has been used.

A main trend of the CIS is a column-parallel output type in which each pixel is provided with a floating diffusion (FD) amplifier, pixels arranged in a matrix in a pixel array are sequentially selected in units of rows in a column direction, and the outputs of the floating diffusion amplifiers are read out. This is because, since it is difficult to achieve the sufficient driving capability in the FD amplifier provided in each pixel, the data rate is lowered and parallel processing is considered to be advantageous. Various types of signal output circuits for the column-parallel output type CIS have been proposed.

As a method used for reading pixel signals of the CIS, there is a method in which photocharge output from a photoelectric conversion element such as a photodiode (which will be hereinafter referred to as a "PD") is temporarily sampled in a capacitor in a later step via a MOS switch arranged in the vicinity of the photodiode and then is read. In this method, however, noises having inverse correlation relative to a sampled capacitance value are generally superposed. Also, in the pixels, when the photocharge is transferred to the capacitor, complete transfer of the photocharge is performed utilizing the potential gradient, and thus, noises are not generated but, when the voltage level of the capacitor is reset to be a predetermined reference value, noises are superposed.

As a typical method used for removing such noises, there is a correlated double sampling (CDS) in which a reset level immediately before sampling of the photocharge is performed is read out and stored, a brightness signal level after the sampling is performed is next read out, and subtraction between these levels is performed, thereby removing the noises.

There are various methods for CDS, and as one of them is a method in which a pixel signal voltage is compared to a Ramp signal voltage by a comparator, AD conversion is performed by counting time until the output of the comparator is inverted, first AD conversion is performed by up count, and second AD conversion is performed by down count, thereby performing CDS in a digital manner (see, for example, Japanese Patent No. 4655500).

Figure 1:
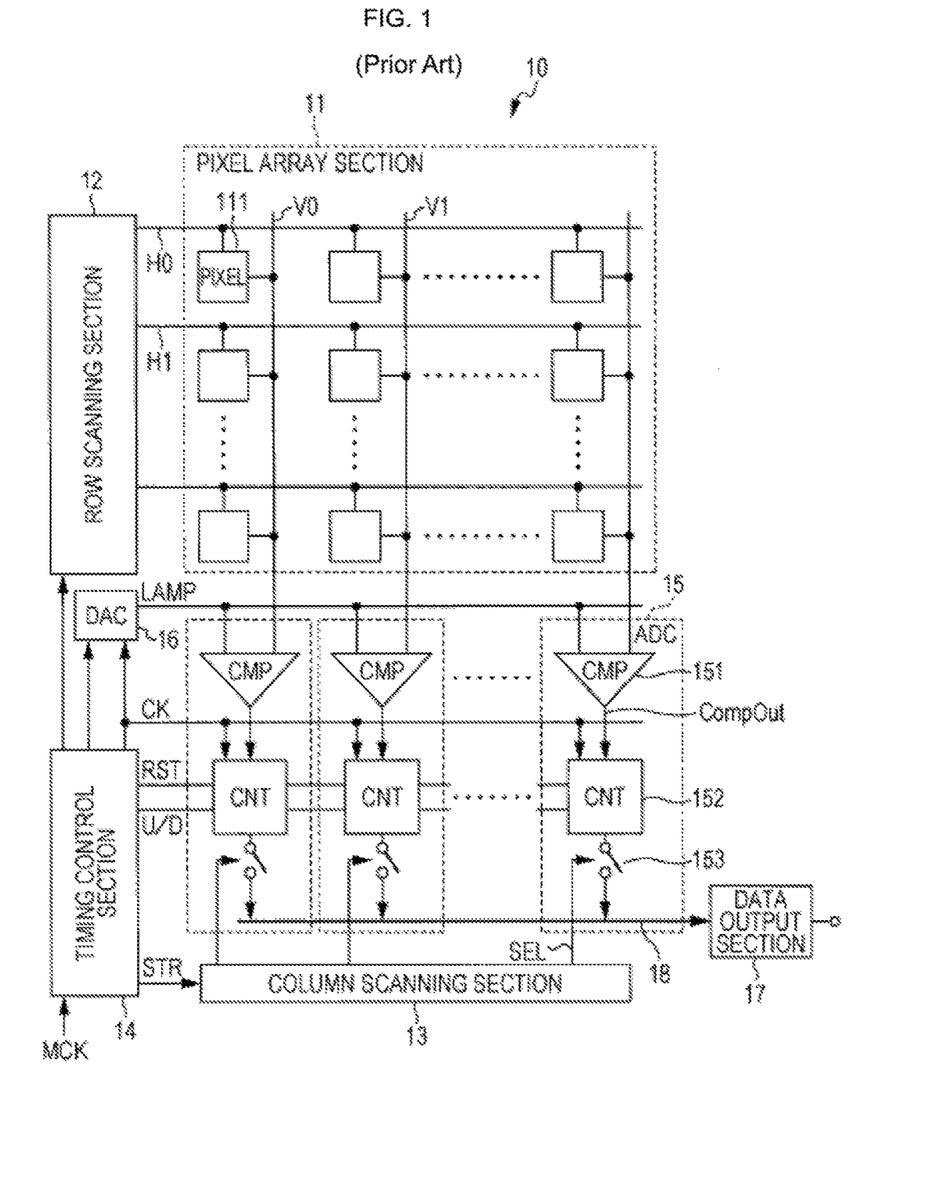
FIG. 1 is a block diagram illustrating an example configuration of a CIS according to the related art.

FIG. 1 is a block diagram illustrating an example configuration of the CIS including an AD conversion section (which will be hereinafter referred to as an "ADC") that performs the above-described CDS in a digital manner.

The CIS 10 includes a pixel array section 11, a row scanning section 12, a column scanning section 13, a timing control section 14, an ADC 15 provided for each column, a DAC 16, and a data output section 17.

The pixel array section 11 is configured such that unit pixels 111, each including a photodiode and a pixel amplifier, are arranged in a matrix. The row scanning section 12, the column scanning section 13, and the timing control section 14 are provided to sequentially read out signals of the pixel array section 11. The row scanning section 12 controls a row address and row scanning. The column scanning section 13 controls a column address and column scanning. The timing control section 14 generates an internal clock.

Each of the ADCs 15 is an integral ADC including a comparator (CMP) 151, an asynchronous up and down counter (CNT) 152, and a switch 153.

The comparator 151 compares a ramp waveform RAMP obtained by changing the waveform of a reference voltage generated by the DAC 16 into a step-like form to an analog signal corresponding to photocharge obtained from the corresponding unit pixel 111 via a column line Vn (n=0, 1, ..., n+1). The asynchronous up and down counter (which will be hereinafter merely referred to as a "counter") 152 has a function of performing, in response to the output of the comparator 151 and a clock CK, up count (or down count) and holding a result of the count, that is, a count value. The switch 153 connects the counter 152 with a data transfer line 18, and is opened and closed by scanning control from the column scanning section 13. The data output section 17 including a sense circuit corresponding to the data transfer line 18 and a subtraction circuit is provided on the data transfer line 18.

The counter 152 having a function as a holding circuit is initially put into an up count (or down count) state to perform reset count and, when the output CompOut of the corresponding comparator 151 is inverted, the up count operation is stopped and the is held. In this case, the initial value of the counter 152 is an arbitrary value in the gradation of AD conversion, that is, for example, 0. In this reset count period, a reset component V of the unit pixel 111 is read out. Thereafter, the counter 152 is put into a down count (or up count) state to perform data count corresponding to the amount of incident light and, when the output CompOut of the corresponding comparator 151 is inverted, the corresponding to a comparison period is held. The count value held in the counter 152 is received as a digital signal by the data output section 17 via the switch 153 which is closed in accordance with scanning control from the column scanning section 13 and the data transfer line 18.

The column scanning section 13 is activated, for example, by supply of a start pulse STR and a master clock MCK from the timing control section 14 to drive a corresponding selection line SEL in synchronization with a drive clock CLK generated on the basis of the master clock MCK, and causes latch data (the held count value) of the counter 152 to be read out to the data transfer line 18.

In the CIS 10 having the above-described configuration, the following processing is performed within 1 horizontal unit period (1H).

That is, in the 1 H, assuming that first read out from the unit pixels 111 in a row Hx to the column line Vn (n=0, 1, . . . , n+1) is P-phase read out PR, first comparison in the comparator 151 is P-phase comparison PC, second read out is D-phase read out DR, second comparison in the comparator 151 is D-phase comparison DC, and post-processing performed after D-phase processing is post D-phase processing DAP, various operations are continuously performed within 1 H.

Timing control of the P-phase read out PR, the P-phase comparison PC, the D-phase read out DR, the D-phase comparison DC, and the post D-phase processing DAP is performed by the timing control section 14.

Next, a specific function of the counter 152 in the ADC 15 will be described.

The counter 152 has a function of switching, while holding the value, the count mode from up count to down count, or from down count to up count, and a function of performing counting at both edges of rises and falls of an input clock CK, i.e., a function of performing counting at a frequency twice the frequency of the input clock. Also, the counter 152 has a function of subtracting a first count value A from a second count value B to calculate a subtraction value B-A.

In order to achieve the above-described functions, special processing is performed in a least significant bit (LSB) circuit of the counter 152, and therefore, a configuration in which a logic inversion selector is used for an output section of the LSB circuit (see, for example, Japanese Patent No. 4853445) has been employed.

Figure 2:
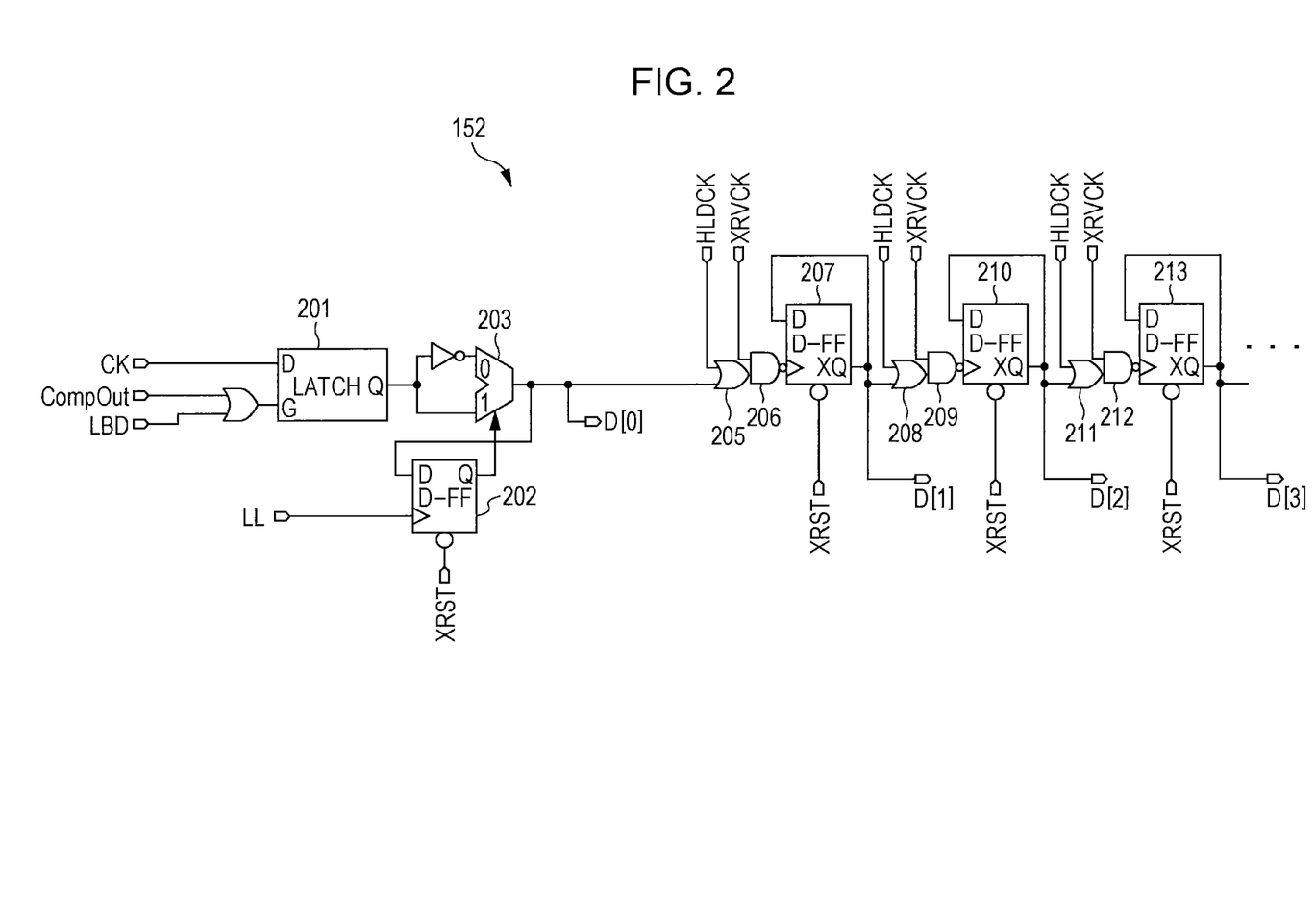
FIG. 2 is a circuit diagram illustrating a first example configuration of a counter constituting an ADC of the CIS.
Figure 3:
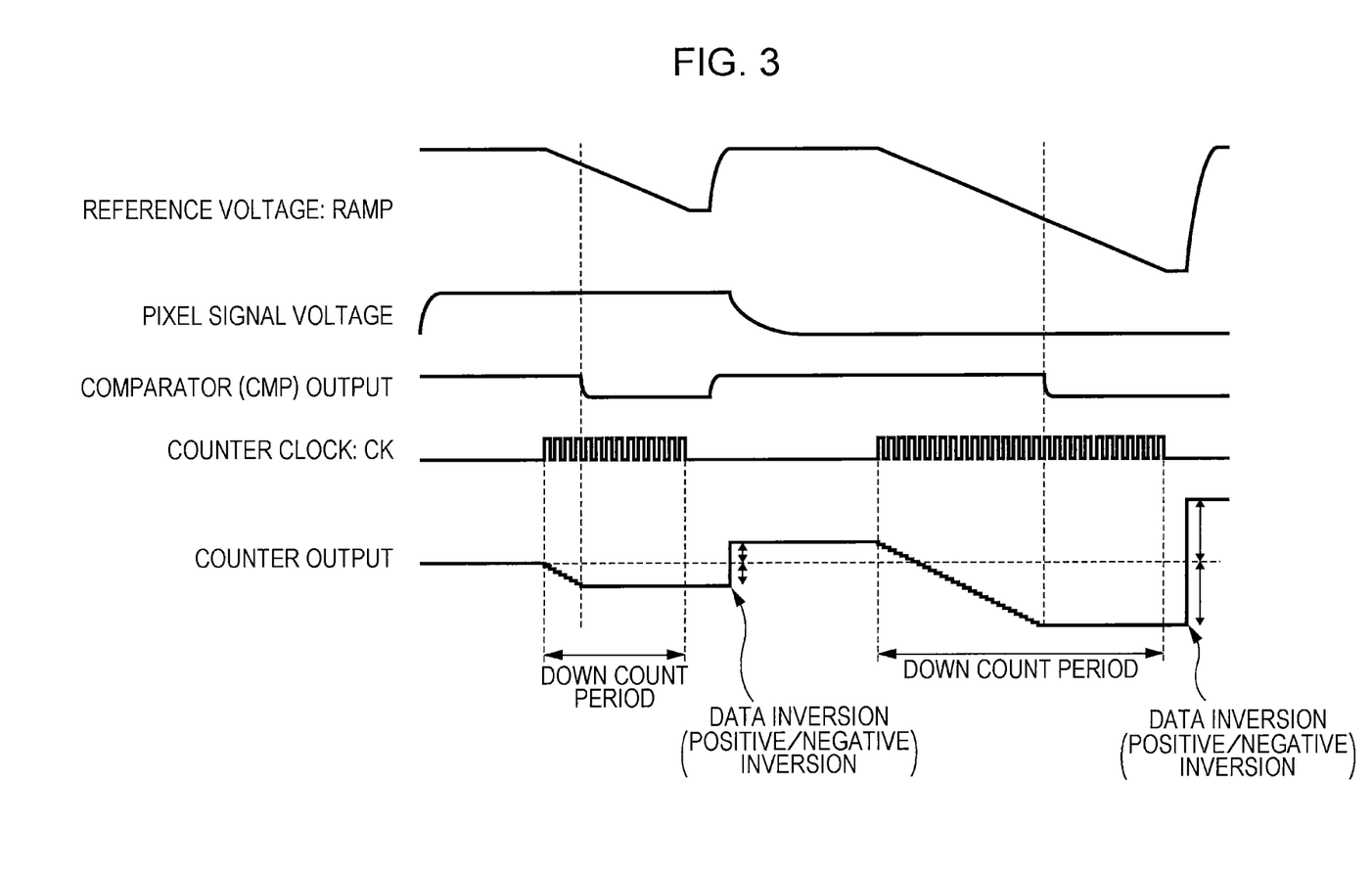
FIG. 3 is a diagram illustrating operation waveforms of the CIS when the counter illustrated in FIG. 2 is employed.

FIG. 2 is a circuit diagram illustrating a first example configuration of the counter 152 using a logic inversion selector for an output of the LSB circuit. FIG. 3 is a diagram illustrating operation waveforms of the CIS 10 when the counter 152 has the first example configuration.

In the first example configuration of the counter 152, the LSB circuit includes a latch circuit 201 that latches the input clock CK, a D type flip-flop circuit (FF) 202 that separately stores the output of the latch circuit 201, and a logic inversion selector 203 that switches between positive and negative inversions of the input clock of the next bit in accordance with data stored in the D type FF 202. The first and subsequent bits in the later stage of the LSB circuit serve as a ripple counter that includes D type FFs 207, 210, and 213 to invert the output of each bit by control from the outside.

Figure 4:
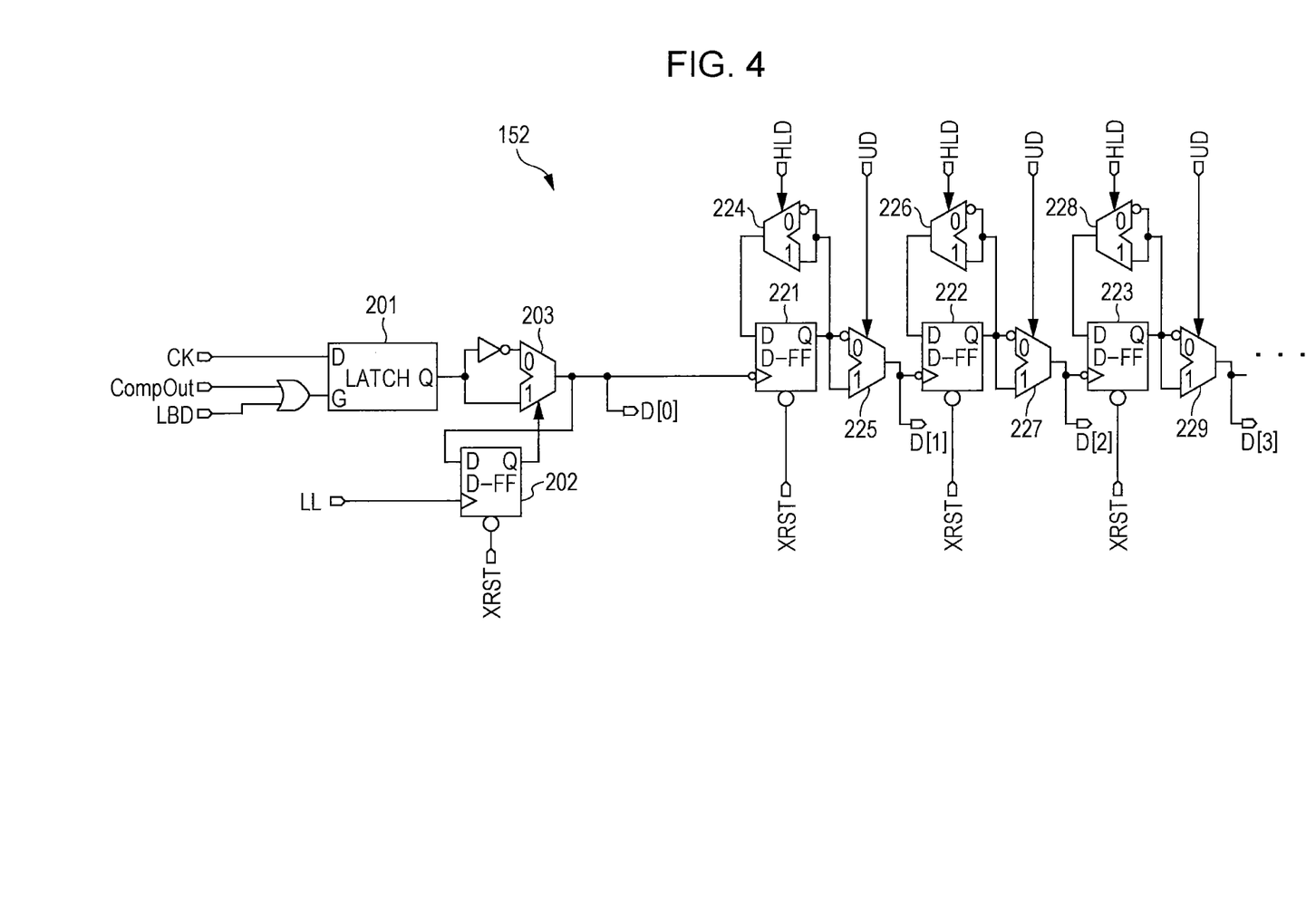
FIG. 4 is a circuit diagram illustrating a second example configuration of the counter constituting the ADC of the CIS.
Figure 5:
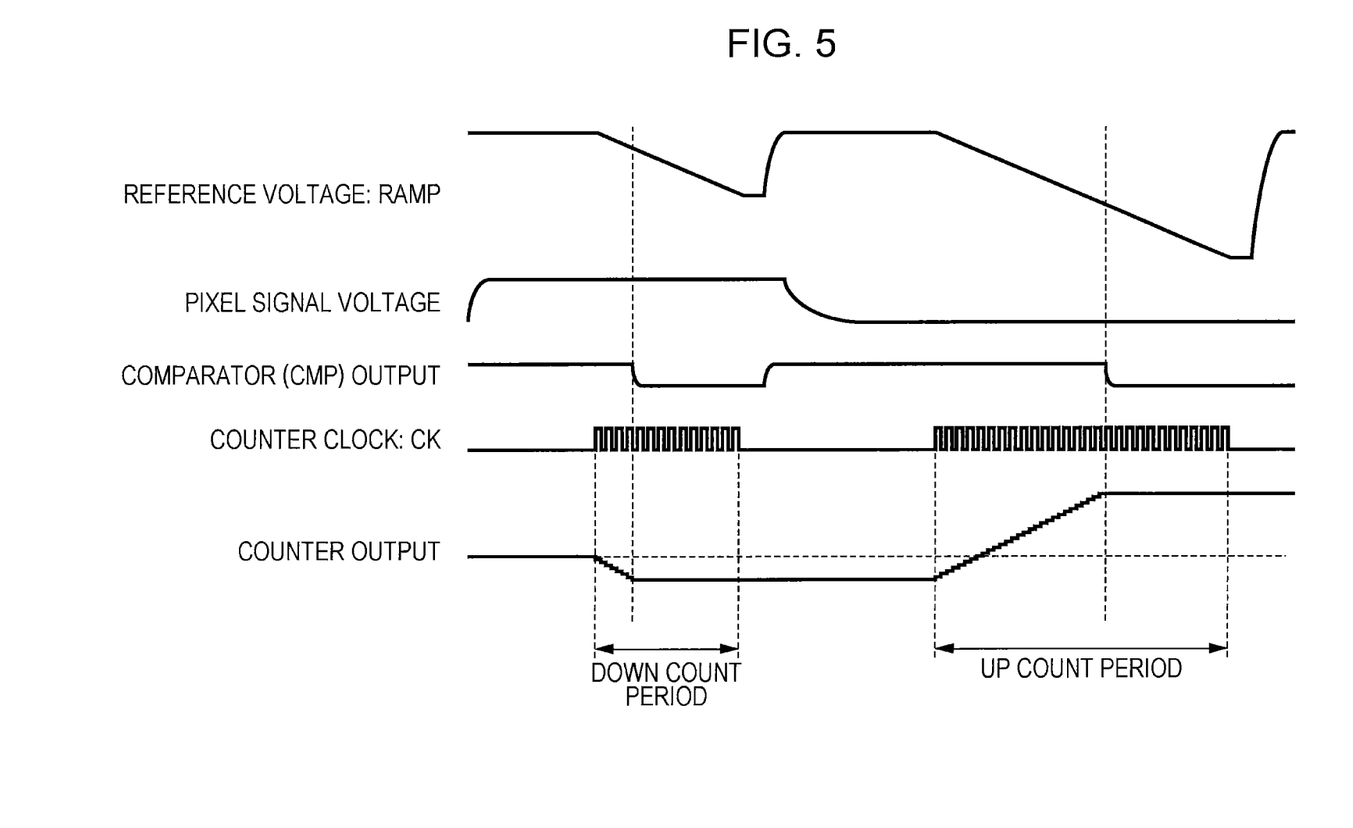
FIG. 5 is a diagram illustrating operation waveforms of the CIS when the counter illustrated in FIG. 4 is employed.

FIG. 4 is a circuit diagram illustrating a second example configuration of the counter 152 using a logic inversion selector for an output of the LSB circuit. FIG. 5 is a diagram illustrating operation waveforms of the CIS 10 when the counter 152 has the second example configuration.

In the second example configuration of the counter 152, the LSB circuit includes a latch circuit 201 that latches the input clock CK, a D type FF 202 that separately stores the output of the latch circuit 201, and a logic inversion selector 203 that switches between positive and negative inversions of the input clock of the next bit in accordance with data stored in the D type FF 202. The first and subsequent bits in the later stage of the LSB circuit serve as a ripple counter that includes D type FFs 221 to 223 and logic inversion selectors 224 to 229 that invert the output of each bit by control from the outside.

SUMMARY

As described above, in each of the first and second example configurations of the counter 152, the logic inversion selector 203 is used for the output section of the LSB circuit. At the time of counting, the logic inversion selector 203 performs high-speed operation in synchronization with a high frequency input clock CK, and thus, consumes a large amount of current.

As described above, the counter 152 is provided for each row of the pixel array section 11, and therefore, the same number of the logic inversion selectors 203, each of which is included in the corresponding counter 152, as the number of rows in the pixel array section 11 are provided. Thus, when the number of the logic inversion selectors 203, each of which consumes a large amount of current, is large, the consumption current of the entire CIS 10 is increased, and the power supply voltage drop amount is increased due to increase in current, thus resulting in reduction in operating voltage margin.

The present disclosure has been made in view of the above-described circumstances, and it is therefore desirable to realize, without using a logic inversion counter that consumes a large amount of current, a counter that counts at both of rising and falling edges of the input clock CK to reduce current consumption as a whole.

According to a first embodiment of the present disclosure, a counter configured to perform counting at both edges of an input clock to output an additional value or a subtraction value for a previous count value and a next count value includes a first latch circuit that latches the input clock, a second latch circuit that latches an output from the first latch circuit, a holding section that holds data of the 0th bit of a count value, and a correction section that performs count correction on data of the first and subsequent bits of the count value on the basis of an output of the second latch circuit and an output of the holding section.

When it is determined on the basis of clock latch data of the next count value which is the output of the second latch circuit and data of the 0th bit of the previous count value which is the output of the holding section that count correction is to be performed on the data of the first and subsequent bits of the count value, the correction section may perform count correction on the data of the first and subsequent bits of the count value by giving a pulse to an input clock in a state where the first latch circuit is put into a through state.

The counter of the first embodiment of the present disclosure may further include a generation section that generates data of the 0th bit of the next count value on the basis of clock latch data of the next count value which is an output of the second latch circuit and data of the 0th bit of the previous count value which is the output of the holding section.

The generation section may generate as the data of the 0th bit of the next count value an exclusive OR of the clock latch data of the next count value which is the output of the second latch circuit and the data of the 0th bit of the previous count value which is the output of the holding section.

According to the first embodiment of the present disclosure, a counting method performed by a counter that includes a first latch circuit that latches the input clock, a second latch circuit that latches an output from the first latch circuit, and a holding section that holds data of the 0th bit of a count value, and that performs counting at both edges of the input clock to output an additional value or a subtraction value for a previous count value and a next count value includes performing count correction on the data of the first and subsequent bits of a count value on the basis of an output of the second latch circuit and an output of the holding section.

According to a second embodiment of the present disclosure, an AD converter includes a comparison section that compares a signal level to a threshold value, and a counter that performs, in a period until an output of the comparison section is inverted, counting at both edges of an input clock to output an additional value or a subtraction value for a previous count value and a next count value, the counter includes a first latch circuit that latches the input clock, a second latch circuit that latches an output from the first latch circuit, a holding section that holds data of the 0th bit of a count value, and a correction section that performs count correction on data of the first and subsequent bits of the count value on the basis of an output of the second latch circuit and an output of the holding section.

According to a third embodiment of the present disclosure, a solid-state imaging device includes a pixel section that outputs a pixel signal corresponding to incident light, and an AD conversion section that AD converts the pixel signal output from the pixel section, the AD conversion section includes a comparison section that compares a level of the pixel signal output by the pixel section to a threshold value, and a counter that performs, in a period until an output of the comparison section is inverted, counting at both edges of an input clock to output an additional value or a subtraction value for a previous count value and a next count value, and the counter includes a first latch circuit that latches the input clock, a second latch circuit that latches an output from the first latch circuit, a holding section that holds data of the 0th bit of a count value, and a correction section that performs count correction on data of the first and subsequent bits of the count value on the basis of an output of the second latch circuit and an output of the holding section.

According to a fourth embodiment of the present disclosure, an electronic device includes an imaging section using a solid-state imaging device, the solid-state imaging device includes a pixel section that outputs a pixel signal corresponding to incident light, and an AD conversion section that AD converts the pixel signal output from the pixel section, the AD conversion section includes a comparison section that compares a level of the pixel signal output from the pixel section to a threshold value, and a counter that performs, in a period until an output of the comparison section is inverted, counting at both edges of an input clock to output an additional value or a subtraction value for a previous count value and a next count value, the counter includes a first latch circuit that latches the input clock, a second latch circuit that latches an output from the first latch circuit, a holding section that holds data of the 0th bit of a count value, and a correction section that performs count correction on data of the first and subsequent bits of the count value on the basis of an output of the second latch circuit and an output of the holding section.

According to the first to fourth embodiments of the present disclosure, count correction is performed by the counter on the data of the first and subsequent bits of the count value on the basis of the output of the second latch circuit and the output of the holding section.

According to the first embodiment of the present disclosure, a counter with reduced consumption current may be realized.

According to the second embodiment of the present disclosure, an AD conversion device with reduced consumption current may be realized.

According to the third embodiment of the present disclosure, a solid-state imaging device with reduced consumption current may be realized.

According to the fourth embodiment of the present disclosure, an electronic device with reduced consumption current may be realized.

DETAILED DESCRIPTION OF EMBODIMENTS

Embodiments of the present disclosure will be hereinafter described with reference to the accompanying drawings. Note that the description is given in the following order.

Example Configuration of Counter

Figure 6:
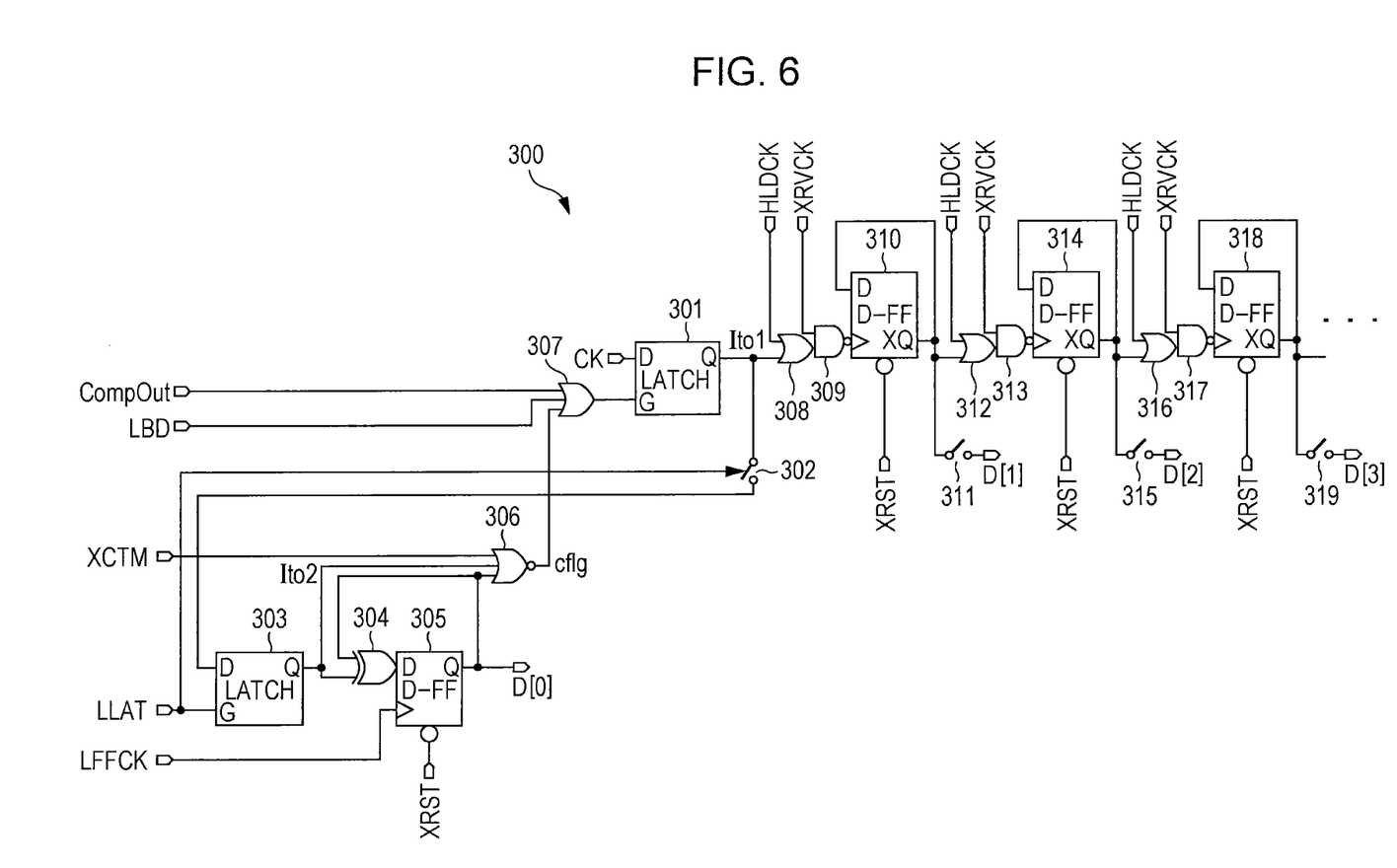
FIG. 6 is a circuit diagram illustrating an example configuration of a counter to which the present disclosure is applied.

FIG. 6 is a circuit diagram illustrating an example configuration of a counter 300 according to an embodiment, with which the counter 152 (FIG. 2 or FIG. 4) constituting the ADC 15 of the CIS 10 illustrated in FIG. 1 may be replaced.

As opposed to the counter 152 illustrated in FIG. 2 or FIG. 4, which makes great use of a logic inversion counter, the counter 300 realizes an operation similar to that of the counter 152 without using a logic inversion counter. In this case, the similar operation to that of the counter 152 means that, when counting is performed at both edges of the input clock CK and it is assumed that the previous count value is A and the next count value is B, the subtraction value B-A is calculated as a predetermined value and is output.

The counter 300 includes an LSB circuit and a ripple counter of the first and subsequent bits.

The LSB circuit of the counter 300 includes a latch circuit 301 that latches the input clock CK, a switch 302, a latch circuit 303 that separately stores the output of the latch circuit 301, an XOR circuit 304, a D-type FF 305 that holds LSB data (data of the 0th bit), an NOR circuit 306, and an OR circuit 307. The ripple counter of the first and subsequent bits is configured to have a similar configuration to that of the ripple counter of the counter 152 of FIG. 2 according to the related art.

However, in the counter 300, a logic inversion selector is not used, an initial value of the clock input at the time of starting counting for the D type FF 310 of the first bit of the ripple counter is an initial value (Low) of the clock at any time. Because of this, for the count values of the first and subsequent bits, a desired subtraction result B-A is not obtained by merely inverting the output of each bit, and an error might be generated. Thus, the counter 300 is configured such that the error generated therein is corrected.

Figure 7:
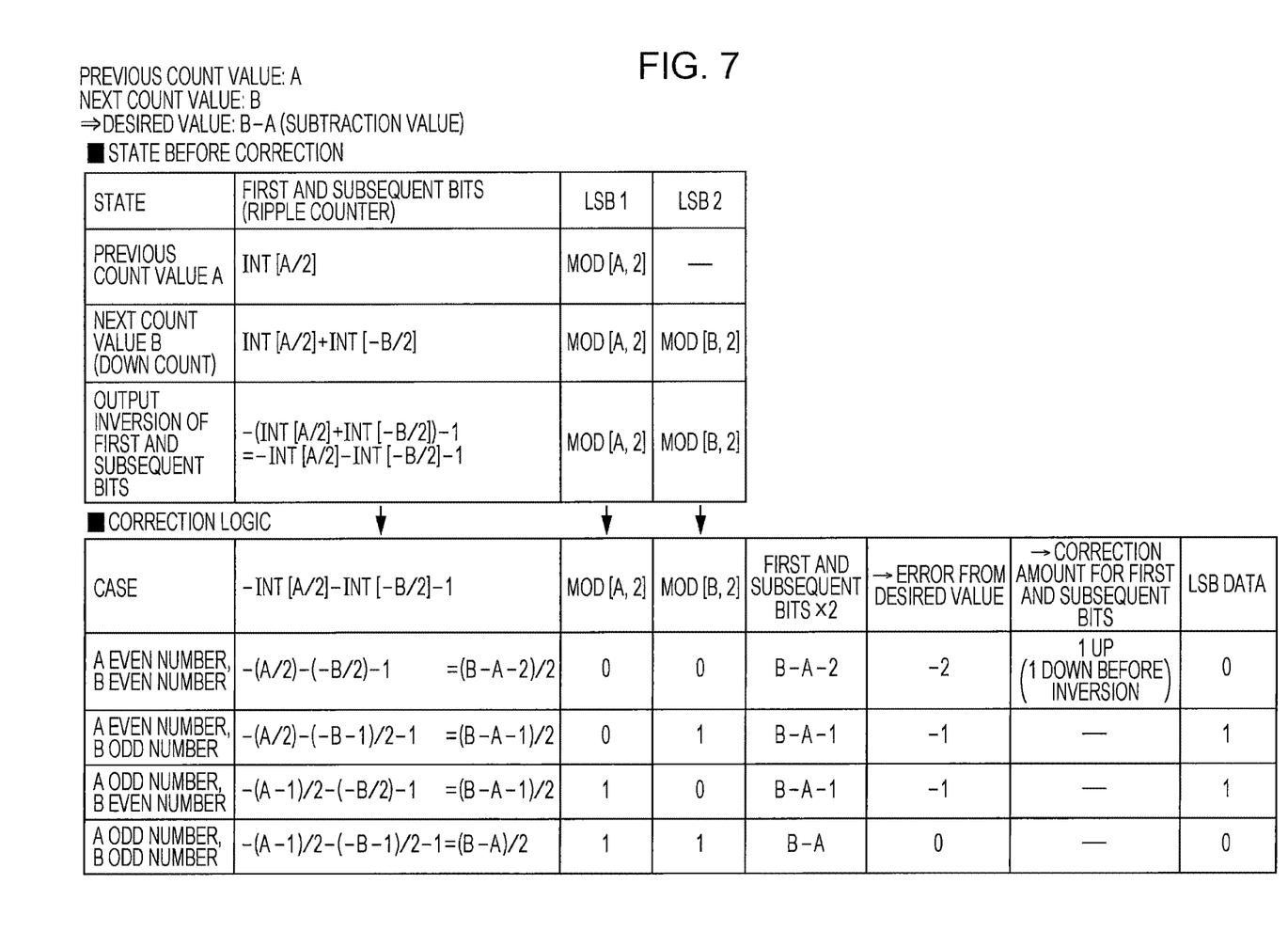
FIG. 7 is a diagram illustrating a correction operation by the counter of FIG. 6.

FIG. 7 is a diagram illustrating a correction operation performed by the counter 300 using logical expressions. Note that, in the following description, INT[a] represents a maximum integer value which does not exceed a, and MOD [A, BJ represents a residue obtained when a is divided by b.

The first and subsequent bits of the previous count value A may be represented by INT[A/2], and the first and subsequent bits of the next count value B may be represented by INT[A/2]+INT[-b/2]. Thus, output inversion of the first and subsequent bits may be expressed by -INT([A/2]+INT[-B/2])-1=-INT[A/2]-INT[-B/2]-1. This may be divided into four cases where each of the previous count value A and the next count value B is an even number or an odd number. Note that, when the count value A is an even number, for the value of the LSB, MOD [A, 2]=0 holds, and when the count value A is an odd number, for the value of the LSB, MOD [A, 2]=1 holds. The same applies to the count value B.

When A and B are even numbers, -INT[A/2]-INT[-B/2]-1=-(A/2)-(-B/2)-1=(B-A-2)/2. When A is an even number and B is an odd number, -INT[A/2)-INT[-B/2)-1=-(A/2)-(-B-1)/2-1=(B-A-1)/2. When A is an odd number and B is an even number, -INT[A/2)-INT[-B/2)-1=-(A/2)/2-(-B-1)-1=(B-A-1)/2. And when A and B are odd numbers, -INT[A/2]-INT[-B/2)-1=-(A-1)/2-(-B-1)/2-1=(B-A)/2.

Counting is performed at both edges of the input clock CK. Thus, assuming that the output inversion of the first and subsequent bits is doubled and the obtained value is compared to the desired value, if A and B are even numbers, an error from the desired value is -2. If one of A and B is an even number and the other is an odd number, an error from the desired value is -1. If A and B are odd numbers, the error from the desired value is 0.

On the basis of the result, since, if the count value A and the count value B are even numbers, there is a shortage of 1 count from the desired value, control is performed, only in this case, such that 1 count additional correction is applied to the first and subsequent bits.

For the 0th bit, data is generated such that, when the value MOD [A, 2] of the LSB of the count value A and the value MOD [B, 2] of the LSB of the count value B are the same (when both of the count values A and B are even numbers or odd numbers), 0 is obtained and, when the value MOD [A, 2] of the LSB of the count value A and the value MOD [B, 2] of the LSB of the count value B are different from each other (when one of the count values A and B is an even number and the other is an odd number), 1 is obtained. In other words, for the 0th bit, the exclusive OR of the value MOD [A, 2] of the LSB of the count value A and the value MOD [B, 2] of the LSB of the count value B is output. Thus, the 0th bit of the desired value B-A may be obtained.

Operation of Counter 300

In an initial state before counting starts, CompOut is 1, and the latch circuit 301 is in a state where the input clock CK is passed through. When input of the input clock CK starts, counting is performed until CompOut becomes 0 and, at the same time when the state of the clock CK at the moment when CompOut becomes 0 is latched by the latch circuit 301, the counting operation of the ripple counter of the first and subsequent bits is stopped.

In this case, both of the output value of the latch circuit 301 and the output value of the D type FF 305, which is data of the 0th bit of the previous count value A, are 0 (when the count values A and B are even numbers), 1 count additional correction is applied to the first and subsequent bits, and therefore, control is performed such that the latch circuit 301 is put into a state where the input clock CK is passed through. However, when the latch circuit 301 is put into the through state, the value held by the latch circuit 301 by the time is broken. Therefore, before the latch circuit 301 is put into the through state, the switch 302 is closed and opened such that the value held by the latch circuit 301 is moved to the latch circuit 303.

Specifically, in the NOR circuit 306, a cflg signal is generated from a timing control signal XCTM that controls timing of putting the latch circuit 301 into the through state for the output of the latch circuit 303, the output of the D type FF 305, and the correction count. Assuming that, while the cflg signal is being generated, 1 pulse is added to the input clock CK as a correction count, if the cflg signal is 1, the ripple counter of the first and subsequent bits is counted by 1 to perform correction count.

Next, when 1 pulse is given to LFFCK, which is to be input to the D type FF 305, the exclusive OR (the output of the XOR circuit 304) of the value of the latch circuit 303 (clock latch data of the next count value B) and the previous output value of the D type FF 305 (the data of the 0th bit of the previous count value) is output as new LSB data of a desired value from the D type FF 305.

By the above-described operation, the desired value B-A may be obtained at any time.

Figure 8:
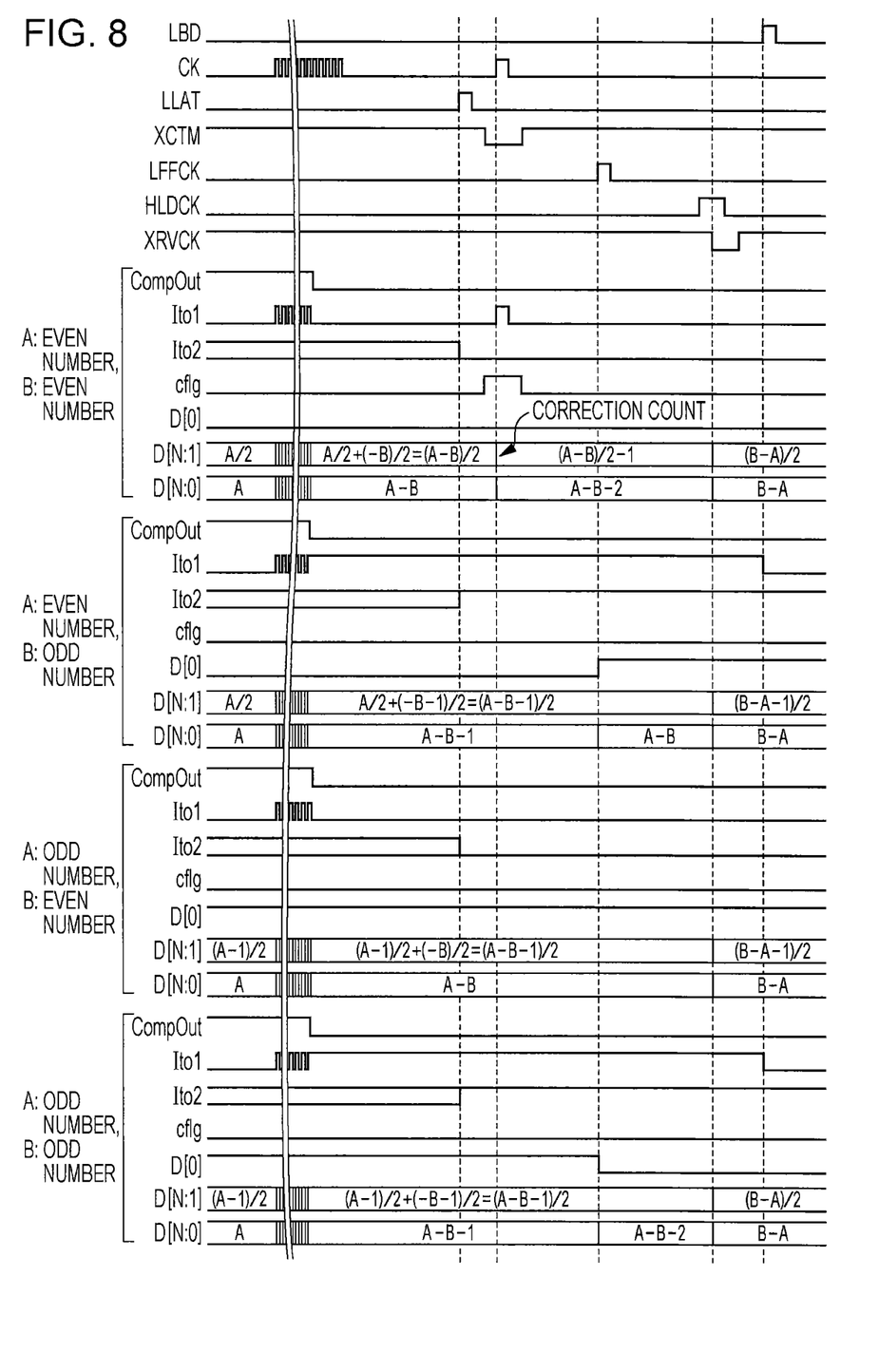
FIG. 8 is a timing chart illustrating an operation of the counter of FIG. 6.

FIG. 8 is a timing chart illustrating the above-described operation of the counter 300. In FIG. 8, four cases where each of the previous count value A and the next count value B is an even number or an odd number are illustrated.

As clearly understood from FIG. 8, only when both of the count values A and B are even numbers, the cflg signal is 1, and counting of the output D[N:1] of the ripple counter is corrected. Also, as for D[O], which is the LSB data, the D type FF 305 is synchronized with LFFCK. Then, if one of the count values A and B is an even number and the other is an odd number, the LSB data is updated and D[O]=1 is output and, if both of the count values A and B are even numbers or odd numbers, the LSB data is updated and D[O]=O is output.

Variation 1

Next, a variation of the configuration including the XOR circuit 304 and the D type FF 305 that update D[O] will be described.

Figure 9A:
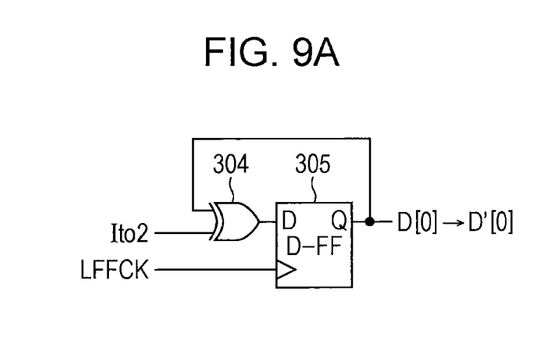
FIGS. 9A and 9B are diagrams illustrating a variation of a circuit configuration that updates D[O]
Figure 9B:
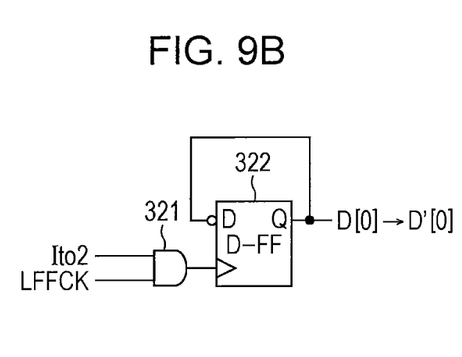
Figure 10:
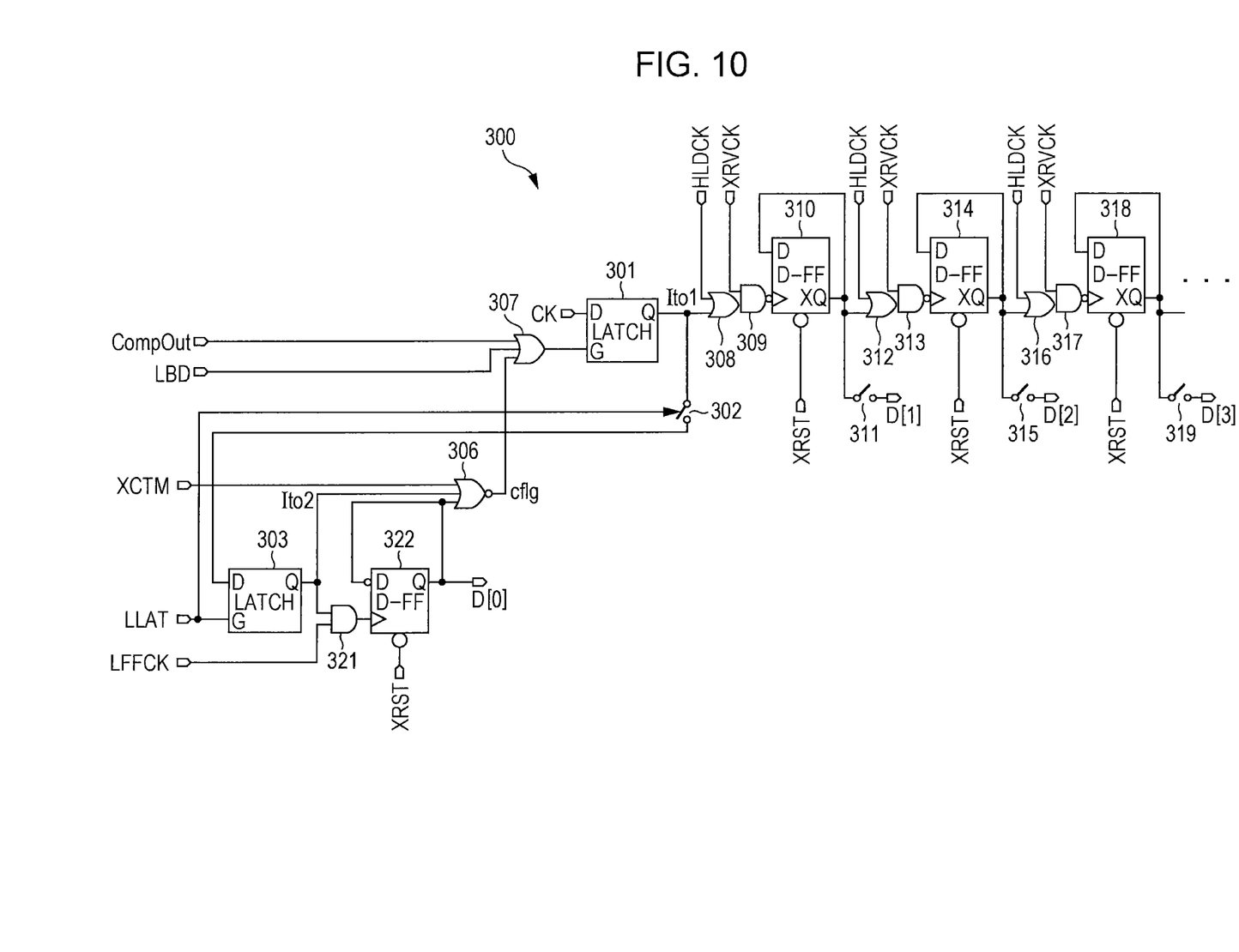
FIG. 10 is a circuit diagram illustrating an example configuration of a counter to which the variation illustrated in FIGS. 9A and 9B is applied.

FIG. 9A is a diagram illustrating the XOR circuit 304 and the D type FF 305 that update D[O], and FIG. 9B is a diagram illustrating a circuit configuration (variation) with which the circuit configuration illustrated in FIG. 9A may be replaced. FIG. 10 is a diagram illustrating the counter 300 of FIG. 6 in which a corresponding part is replaced by the circuit configuration (variation) illustrated in FIG. 9B.

As illustrated in FIG. 9A, the updated LSB data D' [0] to be output from the D type FF 305 is the exclusive OR of the LSB data D[O] of the previous count value A and the previous value Ito2 of the D type FF 305. This circuit configuration may be replaced by an AND circuit 321 and a D type FF 322, as illustrated in FIG. 9B. In this circuit configuration, only when Ito2 is 1, LFFCK is applied to the clock input of the D type FF 322 via the AND circuit 321, the value held in the D type FF 322 is inverted and the obtained value is output.

Variation 2

The above-described counter 300 is used for obtaining the desired value B−A, but may be configured to obtain a desired value B+A by slightly changing the circuit configuration.

Figure 11:
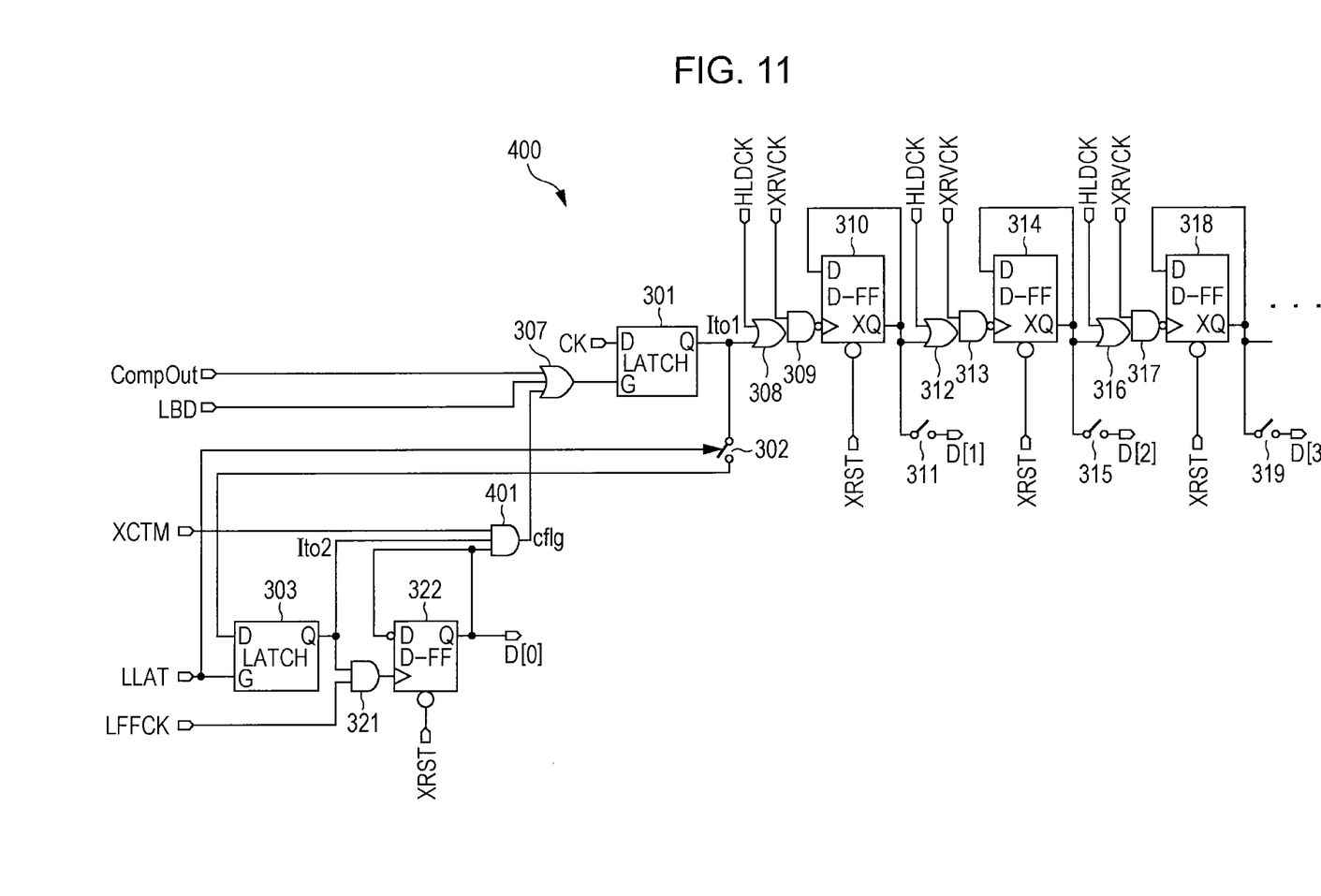
FIG. 11 is a circuit diagram illustrating a variation of a configuration of a counter to which the present disclosure is applied.

FIG. 11 is a circuit diagram illustrating an example configuration of a counter 400, as a variation of the present disclosure, configured to obtain the desired value B+A.

The counter 400 is obtained by replacing the NOR circuit 306 of the counter 300 illustrated in FIG. 10 by an AND circuit 401 and changing one of the input signals thereof from the Low active signal XCTM to the high active signal CMT. As for other components, the same configuration as that of the counter 300 of FIG. 10 is applied, and therefore, the components are identified by the same reference characters.

Figure 12:
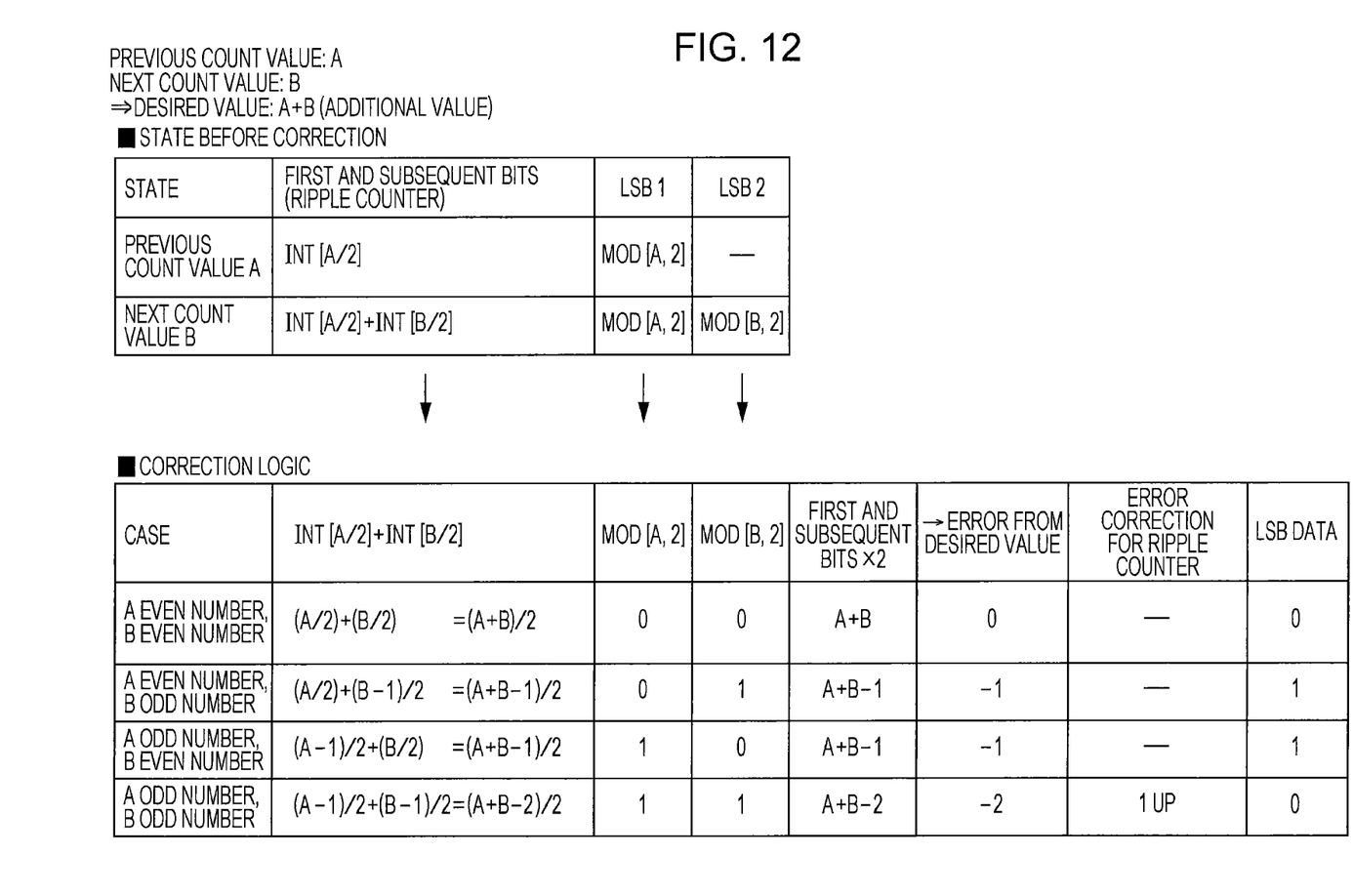
FIG. 12 is a diagram illustrating a correction operation by the counter of FIG. 11.

FIG. 12 is a diagram illustrating a correction operation by the counter 400 using logical expressions.

The first and subsequent bits of the previous count value A may be represented by INT[A/2], and the first and subsequent bits of the next count value B may be represented by INT[A/2]+INT[b/2]. The first and subsequent bits are represented by INT[A/2]+INT[B/2]. This may be divided into four cases where each of the previous count value A and the next count value B is an even number or an odd number.

When A and B are even numbers, INT[A/2]+INT[B/2]=(A/2)+(B/2)=(A+B)/2. When A is an even number and B is an odd number, INT[A/2]+INT[B/2]=(A/2)+(B−1)/2=(A+B−1)/2. When A is an odd number and B is an even number, INT[A/2]+INT[B/2]=(A/2)/2+(B−1)=(A+B−1)/2. And, when A and B are odd numbers, INT[A/2]+INT[B/2]=(A−1)/2+(B−1)/2=(A+B−2)/2.

Counting is performed at both edges of the input clock CK. Thus, assuming that the first and subsequent bits are doubled and the obtained value is compared to the desired value A+B, if A and B are even numbers, an error from the desired value is 0. If one of the A and B is an even number and the other is an odd number, an error from the desired value is −1. If the A and B are odd numbers, an error from the desired value is −2.

On the basis of the result, since, if the count value A and the count value B are odd numbers, there is a shortage of 1 count from the desired value, control is performed only in this case such that 1 count additional correction is applied to the first and subsequent bits.

For the 0th bit, similar to the counter 300, data is generated such that, when the value MOD [A, 2] of the LSB of the count value A and the value MOD [B, 2] of the LSB of the count value B are the same (when both of the count values A and B are even numbers or odd numbers), 0 is obtained, and when the value MOD [A, 2] of the LSB of the count value A and the value MOD [B, 2] of the LSB of the count value B are different from each other (when one of the count values A and B is an even number and the other is an odd number), 1 is obtained. In other words, for the 0th bit, the exclusive OR of the value MOD [A, 2] of the LSB of the count value A and the value MOD [B, 2] of the LSB of the count value B is output. Thus, the 0th bit of the desired A+B may be obtained.

Operation of Counter 400

In an initial state before counting starts, CompOut is 1, and the latch circuit 301 is in a state where the input clock CK is passed through. When input of the input clock CK starts, counting is performed until CompOut becomes 0 and, at the same time when the state of the clock CK at the moment when CompOut becomes 0 is latched by the latch circuit 301, the counting operation of the ripple counter of the first and subsequent bits is stopped.

In this case, if both of the output value of the latch circuit 301 and the output value of the D type FF 305, which is data of the 0th bit of the previous count value A, are 1,1 count additional correction is applied to the ripple counter of the first and subsequent bits, and therefore, control is performed such that the latch circuit 301 is put into the through state. However, when the latch circuit 301 is put into the through state, the value held by the latch circuit 301 is broken. Therefore, before the latch circuit 301 is put into the through state, the switch 302 is closed and opened such that the value held by the latch circuit 301 is moved to the latch circuit 303.

On the other hand, in the AND circuit 401, the cflg signal is generated from the timing control signal CTM that controls timing of putting the latch circuit 301 into a compulsory through state for the output of the latch circuit 303, the inverted output of the D type FF 305, and the correction count. While the cflg signal is being generated, 1 pulse is added to the input clock CK as a correction count to cause the cflg signal to be 1, so that the ripple counter is counted by 1 and the correction count is performed.

Next, when 1 pulse is given to LFFCK, which is to be input to the AND circuit 321, the output D[O] of the D type FF 322 is updated using the exclusive OR of the value of the latch circuit 303 and the previous value of the D type FF 305 as new LSB data of a desired value.

By the above-described operation, the desired A+B may be obtained at any time.

Figure 13:
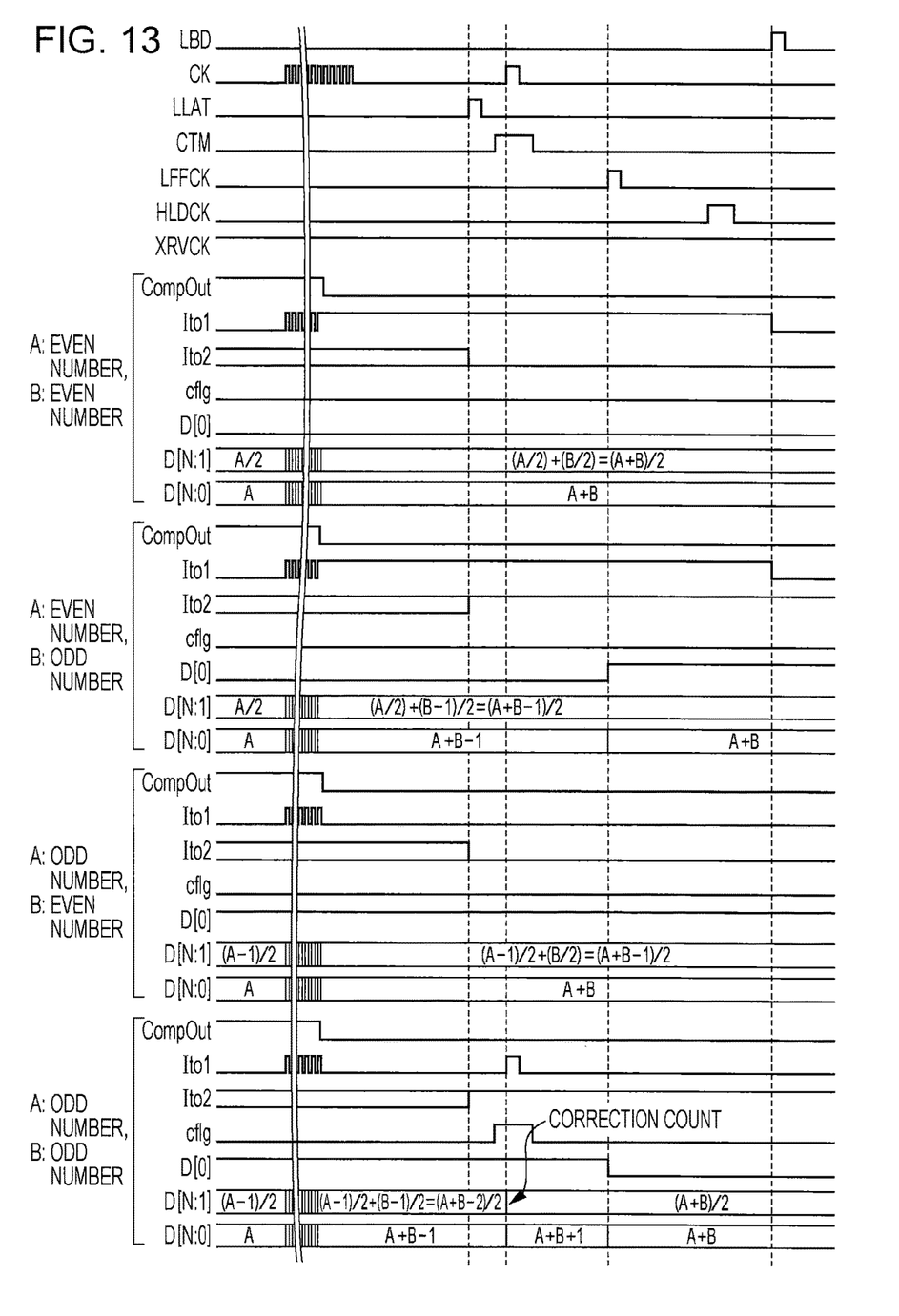
FIG. 13 is a timing chart illustrating an operation of the counter of FIG. 12.

FIG. 13 is a timing chart illustrating the above-described operation of the counter 400. In FIG. 13, four cases where each of the previous count value A and the next count value B is an even number or an odd number. Note that, as described above, the input signal of the counter 400 is different from the input signal of the counter 300 in that XCTM is replaced by CTM and that HLDCK and XRVCK are fixed.

As clearly understood from FIG. 13, only when both of the count values A and B are odd numbers, the cflg signal is 1, and counting of the output D[N:1] of the ripple counter is corrected. Also, for D[O], which is the LSB data, the D type FF 305 is synchronized with LFFCK, then, if one of the count values A and B is an even number and the other is an odd number, the LSB data is updated and D[O]=1 is output and, if both of the count values A and B are even numbers or odd numbers, the LSB data is updated and D[O]=O is output.

As described above, the counter 300 according to an embodiment of the present disclosure may perform counting at both edges of the input clock and calculate the desired value B−A to output the obtained value. Also, the counter 400 as a variation thereof may perform counting at both edges of the input clock and calculate the desired value A+B to output the obtained value.

In each of the counter 300 and the counter 400, a logic inversion counter that operates at high speed in synchronization with the input clock and thus consumes a relatively large current is not used. Thus, as compared to a counter according to the related art, the consumption current of each of the entire counters 300 and 400 may be reduced. Moreover, the voltage drops of the power supply source and the GND are reduced, and therefore, a margin of the operation voltage is increased.

Furthermore, in a counter according to the related art, the operation load and operation current of the latch circuit with a clock that determines the LSB data are changed depending on the state of the logic inversion selector, and thus, AD conversion characteristic (DNL) might vary. However, there is no longer a probability that such a variation is caused in the counter 300 and the counter 400. Thus, the counter 300 and the counter 400 may perform AD conversion under the same condition at any time, and thus, an output error due to an quantization error may be further reduced.

Note that embodiments of the present disclosure are not limited to the above-described embodiment, but may be altered variously in a scope not departing from the spirit of the present disclosure.

The present disclosure contains subject matter related to that disclosed in Japanese Priority Patent Application JP 2012-138604 filed in the Japan Patent Office on Jun. 20, 2012, the entire contents of which are hereby incorporated by reference.

The invention claimed is:

1. A solid-state imaging device, comprising:
 a pixel array circuit configured to output a pixel signal corresponding to incident light; and
 an Analog to Digital (AD) converter configured to AD convert the pixel signal output from the pixel array circuit,
 wherein the AD converter includes:
  a comparator circuit configured to compare a level of the pixel signal output from the pixel array circuit to a threshold value; and
  a counter configured to output one of an addition value or a subtraction value for a previous count value and a next count value,
  wherein the counter includes:
   a correction circuit configured to correct first data of count value based on the previous count value and the next count value.

2. The solid-state imaging device according to claim 1, wherein the correction circuit is an AND circuit.

3. The solid-state imaging device according to claim 1, wherein the correction circuit is a NOR circuit.

4. The solid-state imaging device according to claim 1, wherein the counter further includes:
 a first latch circuit configured to latch a state of an input clock;
 a second latch circuit configured to latch an output from the first latch circuit; and
 a flip-flop circuit configured to hold second data of a 0th bit of the previous count value,
 wherein the correction on the first data of the count value is based on an output of the second latch circuit and the 0th bit of the previous count value, and
 wherein the 0th bit of the previous count value is an output of the flip-flop circuit.

5. The solid-state imaging device according to claim 4, wherein the correction circuit is further configured to correct the first data of the count value based on a pulse given to the input clock to put the first latch circuit into a through state.

6. The solid-state imaging device according to claim 4, further comprising:
 a first circuit configured to generate third data of a 0th bit of the count value based on the output of the second latch circuit and the second data of the 0th bit of the previous count value.

7. The solid-state imaging device according to claim 6, wherein the first circuit is further configured to generate the third data of the 0th bit of the count value based on an exclusive OR of the output of the second latch circuit and the second data of the 0th bit of the previous count value.

8. The solid-state imaging device according to claim 6, wherein the first circuit is further configured to generate the first data of the 0th bit of the count value based on an AND of a flip-flop circuit clock and the output of the second latch circuit.

9. The solid-state imaging device according to claim 1, wherein the counter is further configured to count at both edges of an input clock in a period until an output of the comparator circuit is inverted.

* * * * *